US00RE35109E

United States Patent [19]

Kubota et al.

[11] E Patent Number: Re. 35,109

[45] Reissued Date of Patent: Dec. 5, 1995

[54] SEMICONDUCTOR DEVICE AND METHOD FOR FABRICATING THE SAME

[75] Inventors: Akihiro Kubota, Kawasaki; Rikio Sugiura, Sagamihara; Tsuyoshi Aoki, Kawasaki; Michio Ono, Tokyo, all of Japan

[73] Assignee: Fujitsu Limited, Kawasaki, Japan

[21] Appl. No.: 1,613

[22] Filed: Jan. 7, 1993

Related U.S. Patent Documents

Reissue of:

[64] Patent No.: 4,984,059
Issued: Jan. 8, 1991
Appl. No.: 539,781
Filed: Oct. 7, 1983

[51] Int. Cl.[6] ..... H01L 23/48; H01L 29/46; H01L 29/62; H01L 29/64

[52] U.S. Cl. ..... 257/676; 257/666; 257/787

[58] Field of Search ..... 257/666, 676, 257/787

[56] References Cited

U.S. PATENT DOCUMENTS

| | | | |
|---|---|---|---|
| 4,024,570 | 5/1977 | Hartmann et al. | 357/72 |
| 4,527,185 | 7/1985 | Philofsky et al. . | |
| 4,541,003 | 9/1985 | Otsuka et al. . | |
| 4,984,059 | 1/1991 | Hartmann et al. . | |

FOREIGN PATENT DOCUMENTS

| | | |
|---|---|---|
| 0089044 | 9/1983 | European Pat. Off. . |
| 0040062 | 3/1977 | Japan . |
| 0013776 | 2/1979 | Japan . |
| 0113339 | 9/1980 | Japan . |
| 0140249 | 11/1980 | Japan . |
| 0623345 | 5/1981 | Japan . |
| 0048952 | 3/1993 | Japan . |
| 2036428 | 6/1980 | United Kingdom . |

OTHER PUBLICATIONS

Japanese Unexamined Patent Publication (Kokai) No. 52-127756.

*Primary Examiner*—Sara W. Crane
*Assistant Examiner*—S. V. Clark
*Attorney, Agent, or Firm*—Nakaido, Marmelstein, Murray & Oram

[57] ABSTRACT

In a plastic molded semiconductor device in which inner leads overlap a semiconductor chip in a molded plastic body, the width of the chip may be close to the width of the plastic body without a decrease in the high resistance of the inner leads to the pull out thereof from the plastic body, and the layout of the inner leads may be unrestricted since the inner leads may occupy the region above the chip.

10 Claims, 7 Drawing Sheets

SEMICONDUCTOR DEVICE AND METHOD FOR FABRICATING THE SAME

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a semiconductor device and more specifically to a plastic molded semiconductor device and a method for fabricating the same.

2. Description of the Prior Art

A plastic molded semiconductor device, for example, a plastic molded integrated circuit, is known and is fabricated by assembling and interconnecting a semiconductor chip on a substrate or lead frame and molding the entire structure in plastic, with the exception of the leads, to form the body of the component. In this type of fabrication, a single lead frame made from a metal ribbon and comprising a stage and leads is used, with the result that the leads do not overlap the stage on which the semiconductor chip is mounted.

Although the size of a semiconductor chip tends to be increased, the size of a semiconductor device should be a predetermined size, a row space size, or, preferably, as small as possible so that it can be packed more densely. In a semiconductor device, however, leads must be embedded in plastic in more than a fixed length in order to obtain a required pull out resistance, which limits the maximum size of a stage on which a semiconductor chip is mounted and, therefore, limits the maximum size of a semiconductor chip mounted on the stage if the size of a semiconductor device is predetermined.

Further, recent large-scale integrated circuits tend to have electrodes arranged only on two longitudinally opposed edges of a semiconductor chip. Therefore, it is difficult to form a layout of leads adopted suitable for this arrangement of electrodes, and it is particularly difficult if the width from the outer edge of a plastic body to be molded to near the stage on which a semiconductor chip is mounted is narrow.

SUMMARY OF THE INVENTION

An object of the present invention is to provide a plastic molded semiconductor device in which a larger semiconductor chip can be mounted and to form a layout of leads which is less restricted than that of the prior art case.

Another object of the present invention is to provide a method for fabricating such a semiconductor device.

These and other objects, features, and advantages of the present invention are accomplished by providing a semiconductor device having a molded plastic body, the semiconductor device comprising: the molded plastic body; a stage in the molded plastic body; a semiconductor chip having electrodes and being mounted on the stage in the molded plastic body; and a plurality of leads each consisting of an inner lead portion embedded in the molded plastic body and an outer lead portion extending outside of the molded plastic body, at least one of the leads overlapping the stage, and the leads and the electrodes of the semiconductor chip being interconnected.

The leads preferably overlap not only the stage but also the semiconductor chip so as to crate a larger area for the inner leads. In this case, an insulating layer, preferably a polyimide or silicone film, may be inserted between the leads and the semiconductor chip except for the electrodes of the semiconductor chip. The insertion of an insulating layer is preferable not only for electrically insulating the semiconductor chip from the wires or leads but also for preventing damages resulted from the direct contact of the inner leads to the surface of the semiconductor chip during the wire bonding process.

The present invention also provides a method for fabricating a semiconductor device, including the steps of: mounting a semiconductor chip having electrodes onto a stage; fixing the stage to a lead frame having a plurality of leads each consisting of an inner lead portion and an outer lead portion in such a manner that at least one of the leads overlaps the stage; interconnecting the electrodes of the semiconductor chip and the inner lead portions of the leads; molding the structure of the stage, the semiconductor chip, and the inner lead portions of the leads in plastic; and separating the thus-molded structure from the rest of the lead frame.

The stage may be fixed to the lead frame by welding, such as spot welding or heat pressure welding, or bonding, e.g., with an adhesive, caulking, or the like.

For fixing the stage to the lead frame, a stage alone, a tab comprising a stage and arms, or another lead frame comprising a stage may be used.

BRIEF DESCRIPTION OF THE DRAWINGS

The objects, features, and advantages of the present invention are described with reference to the accompanying drawings.

DESCRIPTION OF THE PREFERRED EMBODIMENTS

Figure 1:
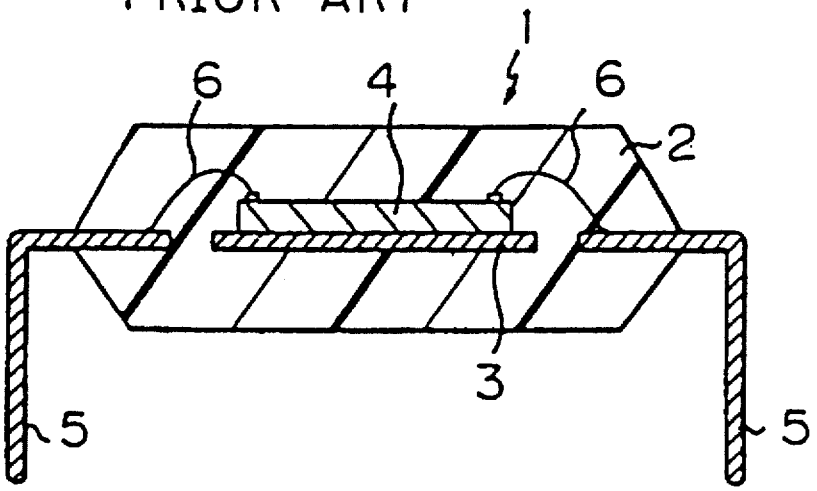
Fig. 1 PRIOR ART
FIG. 1 is a sectional view of a prior art semiconductor device.
Figure 2:
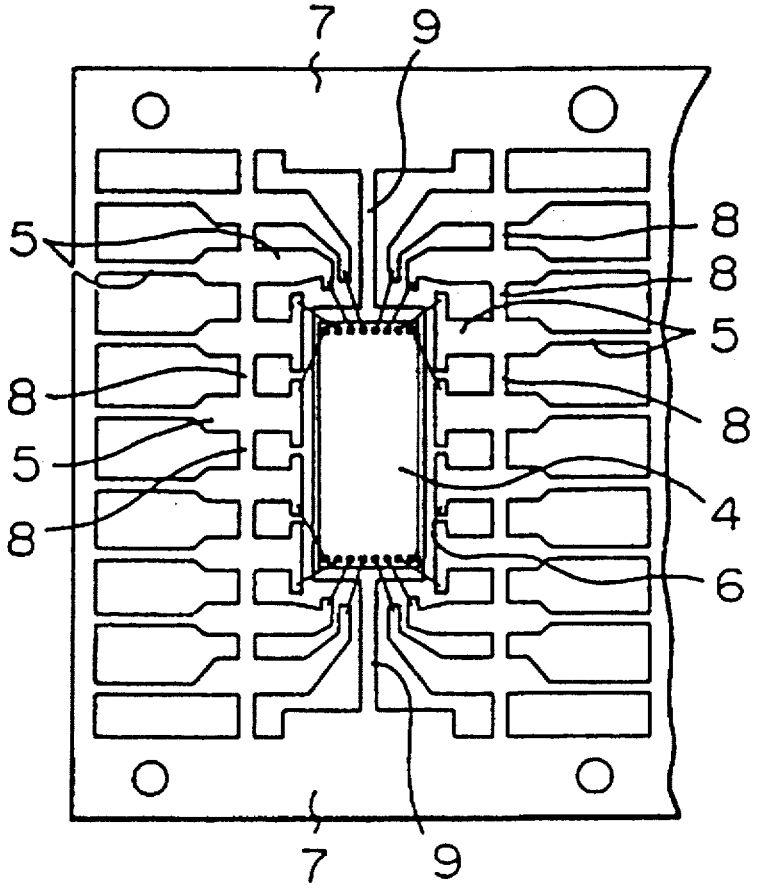
Fig. 2 PRIOR ART
FIG. 2 is a plan view of a prior art assembly of a semiconductor device just before molding is effected.

Before describing the present invention, the prior art is described with reference to FIGS. 1 and 2. In FIG. 1, a semiconductor device 1 comprises a plastic body 2, a stage 3, a semiconductor chip 4, a plurality of leads 5, and wires 6. The stage 3 and the leads 5 consist of a single lead frame made from a metal ribbon by stamping or etching it and, therefore, the leads 5 do not overlap the stage 3. FIG. 2 illustrates an example of patterns of an assembly of a prior art lead frame and a semiconductor chip. In FIG. 2, the same parts as in FIG. 1 are denoted by the same reference numerals. Reference numeral 7 denotes cradles, 8 dam bars, and 9 pinch bars, the cradles 7 and a part of pinch bars 9 near the cradle 7 and the dam bars 8 except for the leads 5 being removed from a finished semiconductor device.

Figure 3:
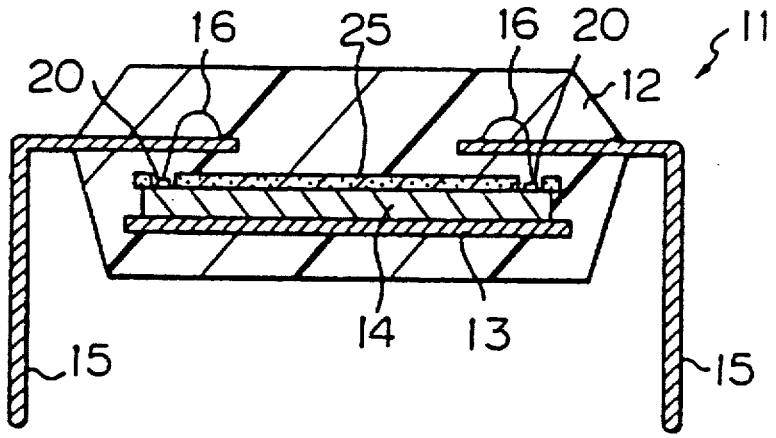
FIG. 3 is a sectional view of a semiconductor device according to the present invention.

FIG. 3 illustrates a semiconductor device 11 according to the present invention. In the figure, reference numeral 12 denotes a plastic body, 13 a stage, 14 a semiconductor chip, 15 a plurality of leads, 16 wires, and 20 electrodes of the semiconductor chip 14. In this device, the leads 15 overlap the stage 13, as well as the semiconductor chip 14, so that the leads 15 have enough depth in the plastic body 12 to give them a high pull out resistance and so that a wide region above the semiconductor chip 14 can be used for extending each of the leads 15 to near a desired electrode 20 of the semiconductor chip 14 irrespective of the size of the semiconductor chip 14, i.e., even if it is a size close to the width of the plastic body 12. Further, in this construction of a semiconductor device, the distance between the leads 15 and the electrodes 20 of the semiconductor chip 14 can be decreased to a minimum so that the expensive wires 16 of, e.g., gold can be shortened and the time period for wire bonding can be greatly shortened, resulting in a reduction of production costs.

Figure 4A:
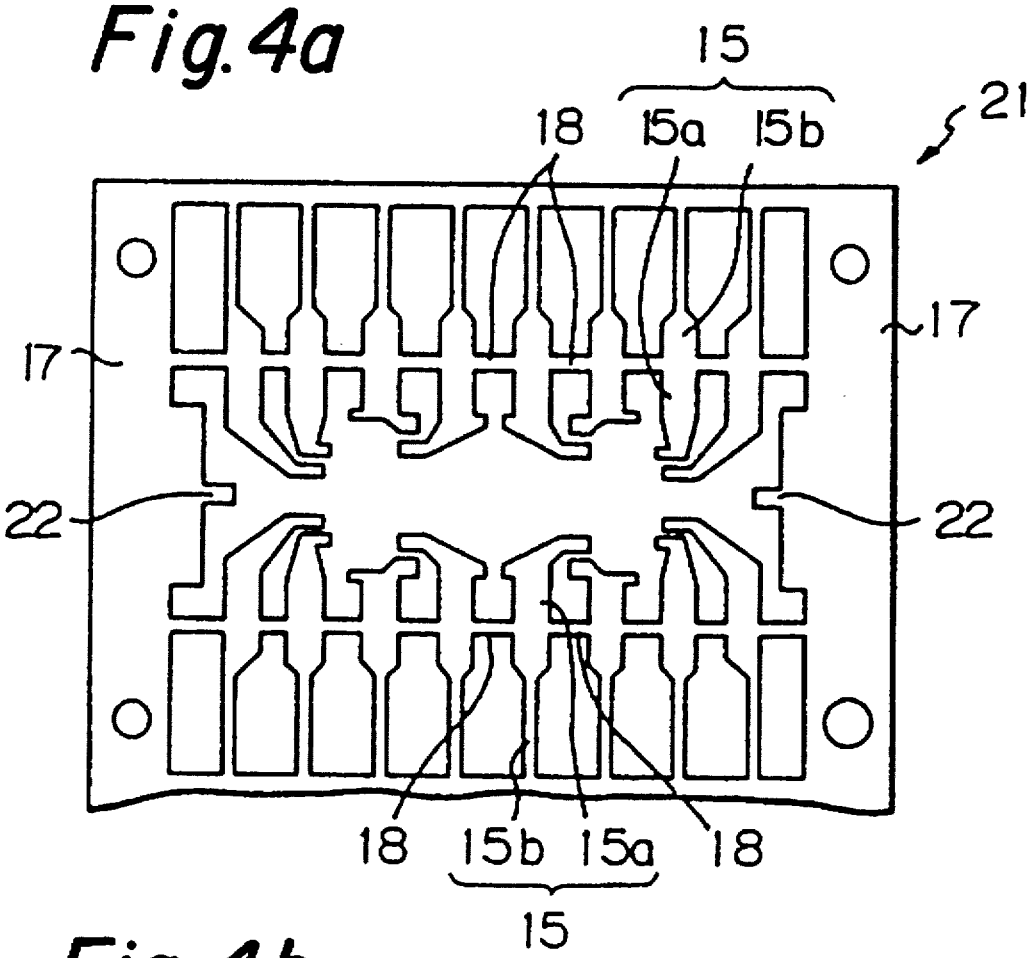
FIG. 4a is a plan view of a lead frame used in combination with a tab.

FIG. 4a illustrates a lead frame according to the present invention. A lead frame 21 is made from a metal ribbon of, e.g., 42-alloy by stamping, etching, etc. and contains several parts, each of which is used for fabricating one semiconductor device. Below, a part of a lead frame from which one semiconductor device is fabricated is described. The lead frame 21 comprises cradles 17 running along the two longitudinal sides of the lead frame itself and provided with alignment holes, a plurality of leads 15 consisting of an inner lead portion 15a and an outer lead portion 15b, dam bars 18 tying the leads 15 to each other and to the cradles 17, and a receiving portion 22 near the cradles 17 for fixing a tab. The lead frame 21 does not include a stage on which the semiconductor chip 14 is mounted since both the leads 15 and a stage cannot be formed from a single metal ribbon due to the overlapping thereof in a semiconductor device according to the present invention.

Figure 4B:
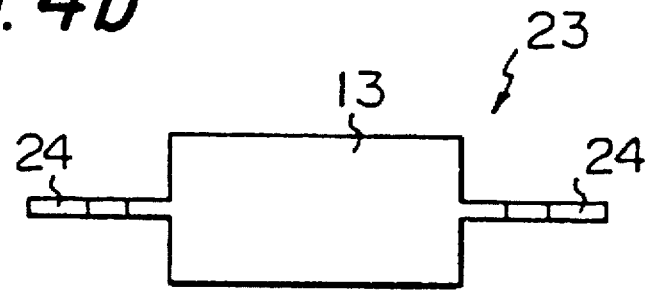
FIGS. 4b and 4c are a plan view and a sectional view, respectively, of a tab.
Figure 4C:
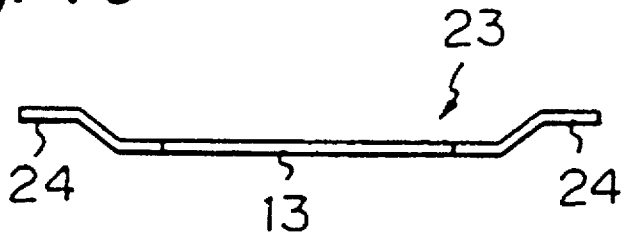

FIGS. 4b and 4c illustrate a tab 23 comprising a stage 13 and two arms 24. The arms 24 are bent to differentiate the levels of the stage 13 and the ends of the arms 24.

Figure 5:
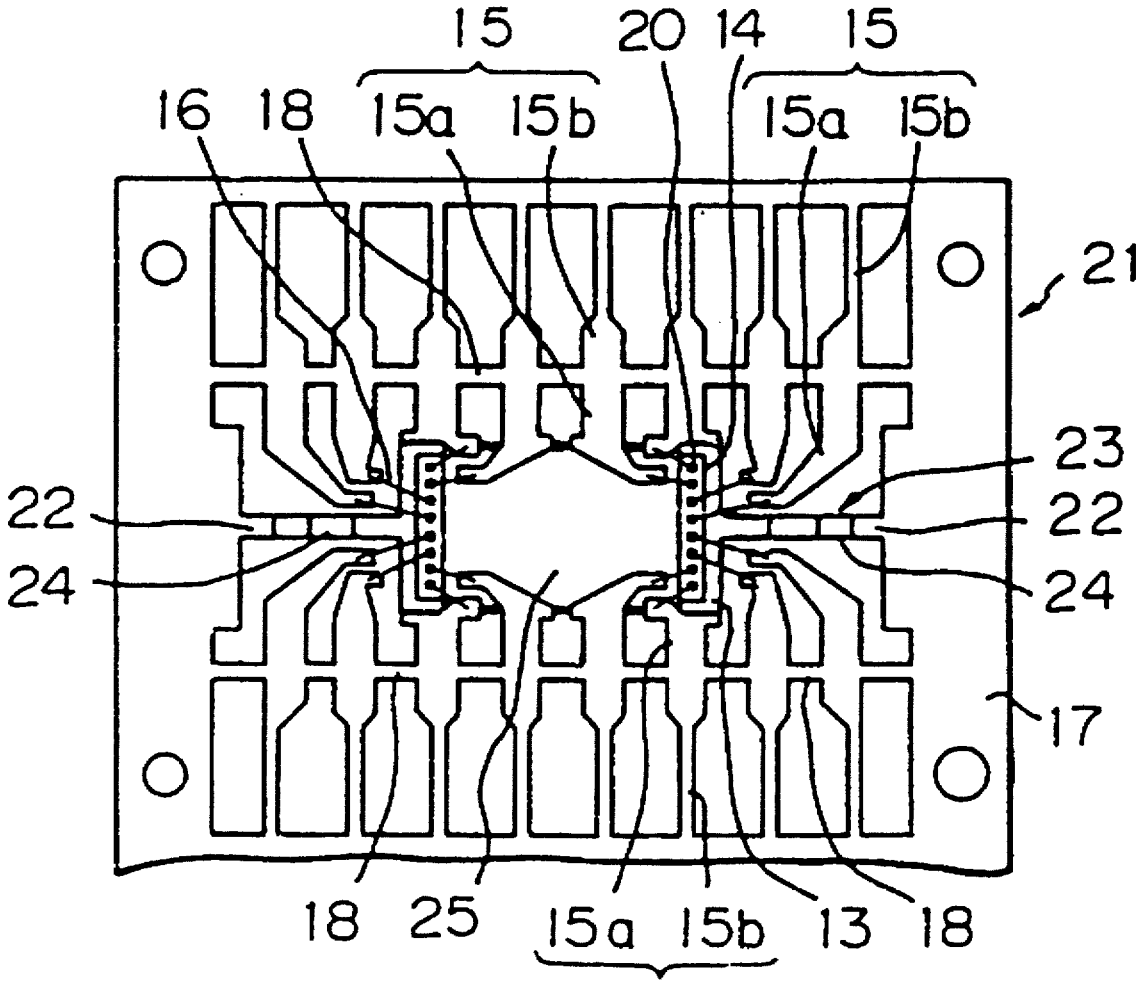
FIG. 5 is a plan view of an assembly before molding.

In the fabrication of a semiconductor device, referring to FIGS. 3 to 5, a semiconductor chip 14 having electrodes 20 is bonded onto a stage 13 of a tab 23 with, e.g., silver paste. An insulating film 25, e.g., a polyimide or silicone tape, 50 λm to 200 λm thick is bonded onto all of the top surface of the semiconductor chip 14 except for the electrodes 20. The insulating film 25 is preferably heat resistant since it will be subjected to heat in later processes. This insulating film 25 may serve not only as an electrical insulating layer but also as a protective layer for a semiconductor chip against damages resulted from direct contacts of leads during wire bonding process. Next, the tab 23 on which the chip 14 is mounted is fixed to a lead frame 21 by welding or bonding the arms 24 of the tab 23 and the tab-receiving portions 22 of the lead frame 21. The type of welding is preferably spot welding or heat pressure welding. An adhesive such as polyimide may be used as a bond. The electrodes 20 of the semiconductor chip 14 and the inner lead portions 15a of the leads 15 are then interconnected by means of, e.g., gold wire bonding.

The thus-assembled and interconnected structure is illustrated in FIG. 5. As can be seen from FIG. 5, the ends of some inner lead portions 15a overlap the stage 13 and the semiconductor chip 14. In FIG. 5, though the semiconductor chip 14 has electrodes 20 arranged along two sides thereof and making a row perpendicular to the row of the leads 15, all of the ends of the inner lead portions 15a extend to near the electrodes 20 of the chip 14 since the leads 15 can occupy the region above the chip 14. This possibility of an unrestricted layout of the inner lead portions is a great advantage of the present invention.

The thus-assembled and interconnected structure comprising the lead frame 21, the tab 23, the chip 14, and the wires 16 is set in an transfer mold comprising on upper half and a lower half. The mold has a mold space having peripheries along the dam bars 18 and near the cradles 17 so that a structure consisting of the stage 13, the chip 14, the inner lead portions 15a of the leads 15, and the wires 16 can be molded in plastic, e.g., epoxy resin. After the molding is carried out, the cradles 17 and the dam bars 18, but not the portions of the leads 15, are removed with a press so as to separate the molded plastic body and the outer lead portions 15b, corresponding to an individual plastic molded semiconductor device. Conventional processes such as metal plating, bending the outer lead, etc. may then be carried out.

In accordance with the present invention, a semiconductor device having a molded plastic body 6.6 mm wide can contain a semiconductor chip 5.5 mm wide and can have a high resistance to withdrawal of the leads. In comparison, a prior art semiconductor device having a molded plastic body 6.6 mm wide can contain only a semiconductor chip 4 mm wide at the maximum since the depth of the inner leads and the space between the inner leads and the stage must be at least 1 mm and 0.3 mm, respectively.

Figure 6A:
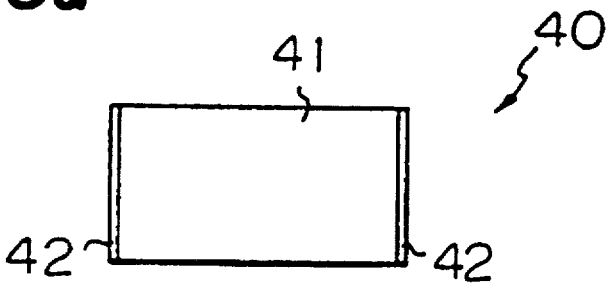
FIG. 6a is a plan view of a capacitor stage.
Figure 6B:
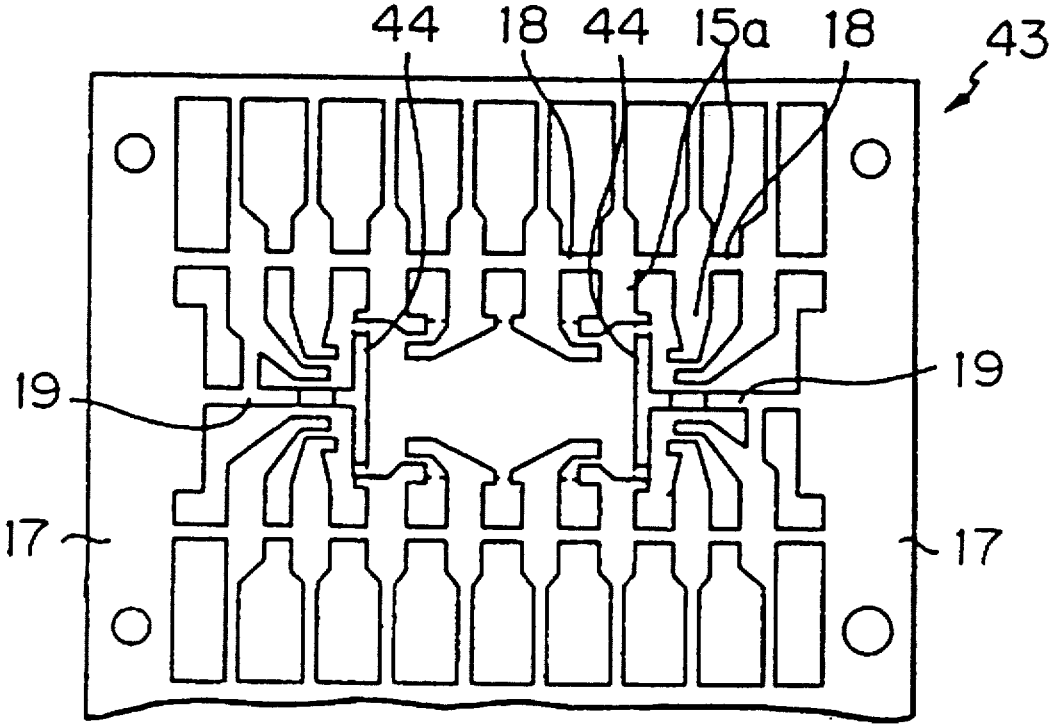
FIG. 6b is a plan view of a lead frame used in combination with the capacitor stage of FIG. 6a, and FIG. 6c is a partial sectional view of the assembly of the capacitor stage, a chip, and the lead frame.
Figure 6C:
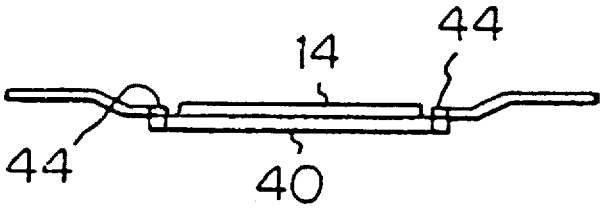

FIGS. 6a, 6b, and 6c illustrate another embodiment of the present invention in which a stage on which a semiconductor chip is mounted is a capacitor. For example, a capacitor 40 is made of a ceramic plate 41 of, e.g., alumina provided with electrodes 42. The capacitor 40 is fixed to a lead frame 43 at the point indicated by the broken lines in FIG. 6b after a semiconductor chip 14 is mounted onto the capacitor 40. To fix the capacitor 40 to the lead frame 43, the lead frame 43 may have receiving portions 44 which do not overlap the inner lead portions of the leads. Thus, the capacitor 40 may be directly fixed to the lead frame 43. The capacitor itself is proposed as a stage for improving the characteristics of a semiconductor chip mounted on the stage.

An armless metal stage may be used in combination with a lead frame similar to that of FIG. 6b.

Figure 7A:
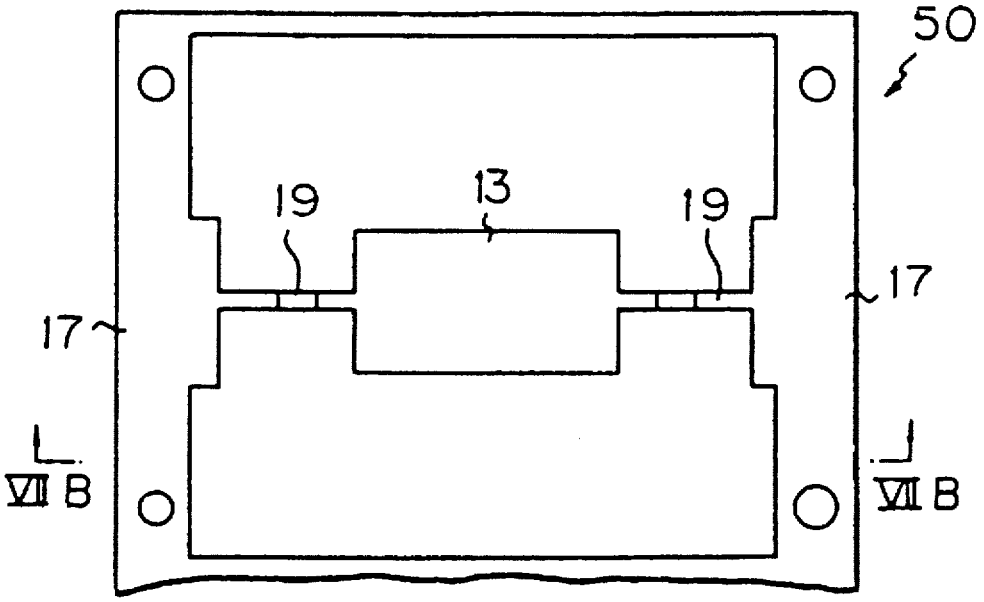
FIG. 7a and FIG. 7b are plan view and sectional view taken along the line VIIA—VIIA in FIG. 7a of a lead frame.
Figure 7B:
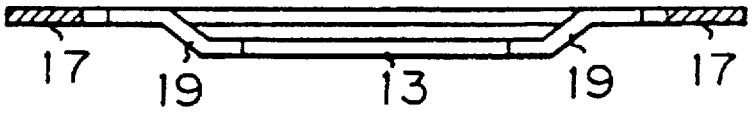
Figure 7C:
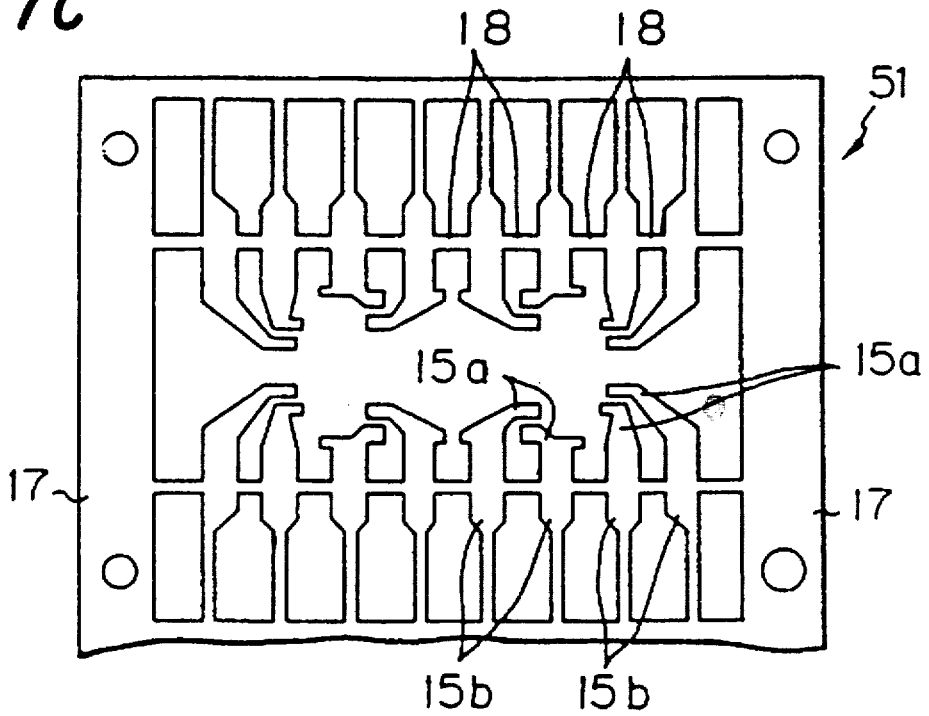
FIG. 7c is also a plan view of a lead frame, the lead frame of FIG. 7a and the lead frame of FIG. 7c being used in combination.

FIGS. 7a and 7b illustrate a further embodiment of the present invention in which two lead frames are used for fabricating a semiconductor device. In this embodiment, a stage 13 is formed as a part of a first lead frame 50 and is tied to cradles 17 with pinch bars 19. A second lead frame 51 is similar to the lead frame 21 in FIG. 4a except that the tab-receiving portions are removed.

Figure 8A:
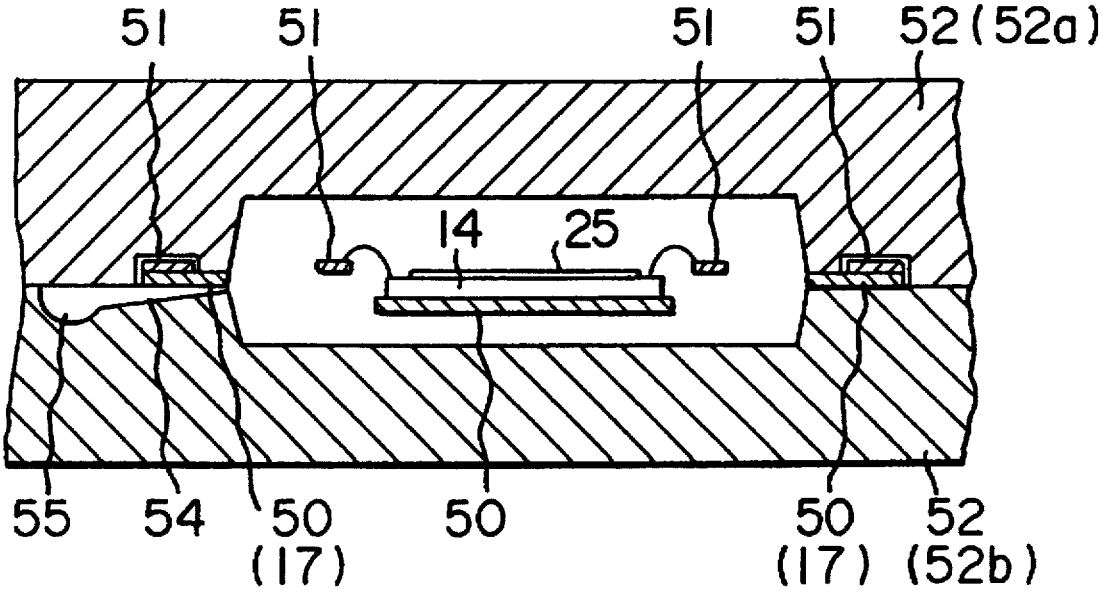
FIGS. 8a and 8b are cross-sectional view of and a longitudinal sectional view of a mold including the assembly of two lead frames and a chip.
Figure 8B:
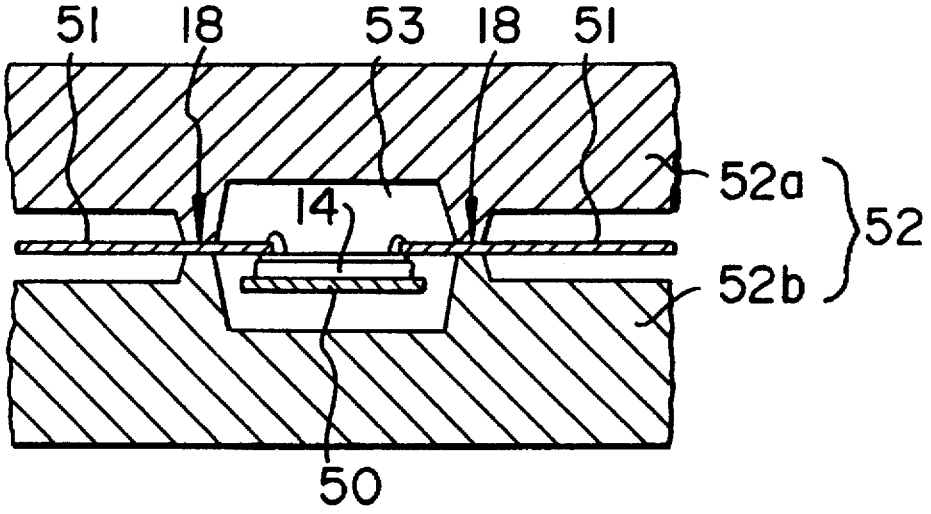

The assembling and interconnecting processes are similar to those in the embodiments described before except that the stage 13 is fixed to the second lead frame 51 by fixing the two lead frames 50 and 51 to each other by, preferably, welding some portions of the cradles 17. In the molding process, a particular mold adopted for receiving two lead frames is necessary. FIGS. 8a and 8b illustrate a cross-sectional and a longitudinal sectional view, respectively, of such a particular mold including an assembly of two lead frames and a semiconductor chip. As can be seen from FIGS. 8a and 8b, a mold 52 comprising an upper half 52a and an lower half 52b holds a single lead frame of the second lead frame 51 at the dam bars 18 thereof and has apertures for receiving the laminations of two cradles. A mold space 53 contains the assembly of a stage, a chip, and inner lead portions of leads and is connected by a gate 54 to a runner 55 which is connected to a cull (not shown), from where transfer plastic material is fed into the mold space 53.

Figure 9:
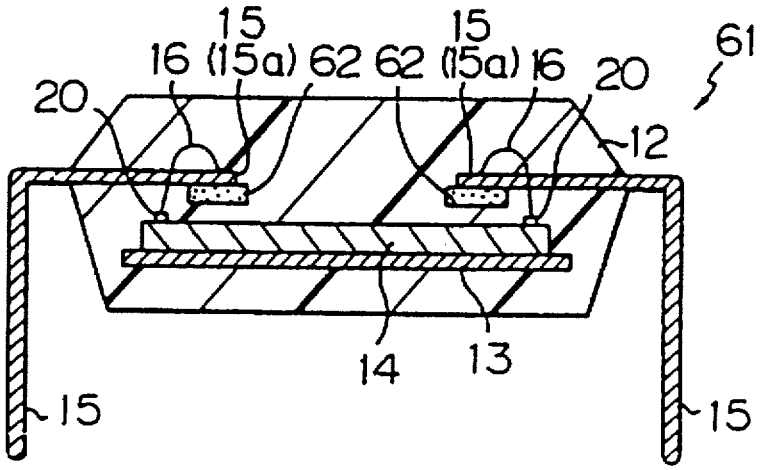
FIGS. 9 and 10 are sectional views of further semiconductor devices according to the present invention.

FIG. 9 illustrates still another embodiment of the present invention in which an insulating layer is inserted between the semiconductor chip and a part of the leads, but not on or above the entire surface of the semiconductor chip except for the electrodes.

In a semiconductor device 61 in FIG. 9, insulating films 62 are inserted between the semiconductor chip 14 and the end portions of the lead 15 (15a). This insertion of the insulating film may be effected by adhering the insulating films 52 to the top surface of the semiconductor chip 14 or to the end portions of the leads 15 (15a). FIG. 9 illustrates the former case. This insulating film can also protect a semiconductor chip 14 from damages resulted from direct contacts of the end portions of leads 15 (15a) when wire bonding is effected.

Figure 10:
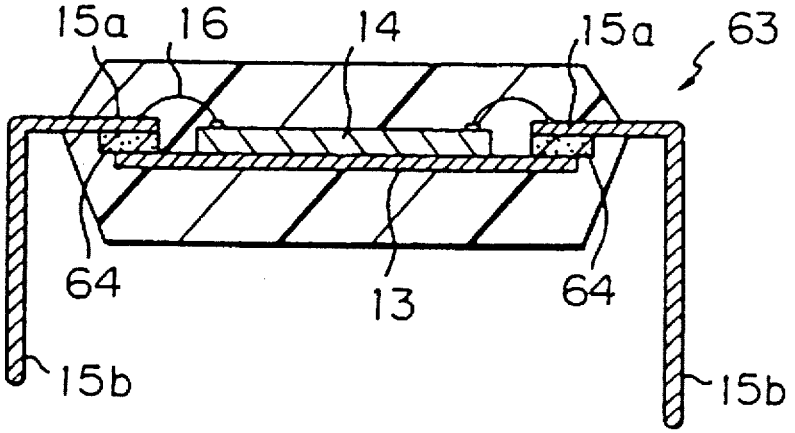

FIG. 10 illustrates still a further embodiment of the present invention in which inner leads 15a overlap a stage 13 but not a semiconductor chip 14. In this semiconductor device 63, an insulating layer 64 is inserted between the inner leads 15a and the stage 13.

We claim:

1. A semiconductor device having a molded plastic body, said semiconductor device comprising:

a semiconductor chip having a major surface and having electrodes formed on said major surface, said semiconductor chip being encapsulated in the molded plastic body;

*a single piece metal member having* a thin, flat, self-supportive metal stage *portion* onto which said semiconductor chip is bonded so that said major surface is opposite to and faces said metal stage *portion and a pair of extending portions each of which is extending from opposite sides of said stage portion toward a surface of the molded plastic body*, said stage *portion* being encapsulated in said molded plastic body;

a plurality of leads, each comprising an inner lead end portion embedded in the molded plastic body and an outer lead end portion extending outside of the molded plastic body, said inner lead end portions of the leads being spaced apart from said semiconductor chips, said inner lead end portion of at least one of the leads overlapping said stage *portion* and extending over said major surface of said semiconductor chip; and interconnection wires interconnecting each of said inner lead end portions and each of said electrodes of said semiconductor chip.

2. A semiconductor device having a molded plastic body, said semiconductor device comprising:

a semiconductor chip having electrodes and being encapsulated in the molded plastic body;

*a single piece metal member having* a thin, flat, self-supportive metal stage *portion* onto which said semiconductor chip is bonded *and a pair of extending portions each of which is extending from opposite sides of said stage portion toward a surface of the molded plastic body*, said stage *portion* being encapsulated in said molded plastic body;

a plurality of leads, each comprising an inner lead end portion embedded in the molded plastic body and an outer lead end portion extending outside of the molded plastic body, said inner lead end portions of the leads being spaced apart from said semiconductor chips, said inner lead end portion of at least one of the leads overlapping said stage *portion* and said semiconductor chip; and interconnection wires interconnecting each of said inner lead end portions and each of said electrodes of said semiconductor chip, wherein said electrodes are arranged along at least one side of said semiconductor chip and said inner lead end portion of at least one of said leads extends over said semiconductor chip to a position adjacent to inner sides of said electrodes relative to said semiconductor chip.

3. A semiconductor device according to claim 2, wherein an insulating film covers an entire top surface of the semiconductor chip except for the electrodes thereof.

4. A semiconductor device according to claim 2, wherein an insulating film exists in part of the space between the semiconductor chip and only the inner lead end portions of the leads.

5. A semiconductor device according to claim 4, wherein the insulating film between the semiconductor chip and the inner lead end portions of the leads is adhered to the end portion of the leads.

6. A semiconductor device according to claim 4, wherein the insulating film between the semiconductor chip and the inner lead end portions of the leads is adhered to the semiconductor chip.

7. A semiconductor device according to claim 3 or 4, wherein the insulating film is of polyimide.

8. A semiconductor device according to claim 3 or 4, wherein the insulating film is silicone.

9. A semiconductor device according to claim 2, wherein the inner lead end portions of the leads are arranged in at least one row, said electrodes of the semiconductor chip being arranged along two sides of the semiconductor chip forming rows of electrodes which run perpendicular to at least one row of leads.

10. A semiconductor device having a molded plastic body, said semiconductor device comprising:

a semiconductor chip having electrodes and being encapsulated in the molded plastic body;

*a single piece metal member having* a thin, flat, self-supportive metal stage *portion* onto which said semiconductor chip is bonded *and a pair of extending portions each of which is extending from opposite sides of said stage portion toward a surface of the molded plastic body*, said stage *portion* being encapsulated in said molded plastic body;

a plurality of leads, each comprising an inner lead end portion embedded in the molded plastic body and an outer lead end portion extending outside of the molded plastic body, said inner lead end portions of the leads being spaced apart from said semiconductor chips, said inner lead end portion of at least one of the leads overlapping said stage *portion* and said semiconductor chip; and interconnection wires interconnecting each of said inner lead end portions and each of said electrodes of said semiconductor chip, wherein the stage is a capacitor made of a ceramic plate having two electrodes, each electrode being interconnected to one of the leads.

* * * * *